(12) United States Patent  
Wu

(10) Patent No.: US 7,402,874 B2  
(45) Date of Patent: Jul. 22, 2008

(54) ONE TIME PROGRAMMABLE EPROM FABRICATION IN STI CMOS TECHNOLOGY

(75) Inventor: Xiaoju Wu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 150 days.

(21) Appl. No.: 11/118,642

(22) Filed: Apr. 29, 2005

(65) Prior Publication Data

US 2006/0244036 A1    Nov. 2, 2006

(51) Int. Cl.  
*H01L 29/788* (2006.01)

(52) U.S. Cl. ............... 257/401; 257/315; 257/E29.027; 257/E29.136

(58) Field of Classification Search ......... 257/314–316, 257/401, E29.027, E29.136, 319, 320, 506, 257/E29.307, E29.026  
See application file for complete search history.

(56) References Cited

U.S. PATENT DOCUMENTS

| 5,400,278 | A | * | 3/1995 | Kunori et al. | ............... 365/182 |
| 6,639,270 | B2 | | 10/2003 | Dray | |
| 2002/0175353 | A1 | * | 11/2002 | Dray et al. | ................... 257/260 |

* cited by examiner

*Primary Examiner*—Matthew C Landau  
(74) *Attorney, Agent, or Firm*—Wade J. Brady, III; Frederick J. Telecky, Jr.

(57) ABSTRACT

The formation of a one time programmable (OTP) transistor based electrically programmable read only memory (EPROM) cell (100) is disclosed. The cell (100) includes multiple concentric rings (108, 110) out of which gate structures are formed. An inner transistor based cell (130) formed from the inner ring (108) is shielded from isolation material (106) by one or more outer rings (110). The lack of overlap between the inner transistor and any isolation material promotes enhanced charge/data retention by mitigating high electric fields that may develop at such overlap regions (30, 32).

20 Claims, 7 Drawing Sheets

ONE TIME PROGRAMMABLE EPROM FABRICATION IN STI CMOS TECHNOLOGY

FIELD OF INVENTION

The present invention relates generally to semiconductor devices and more particularly to forming a one time programmable (OTP) EPROM cell with improved data retention.

BACKGROUND OF THE INVENTION

One time programmable (OTP) electrically programmable read only memory (EPROM) can be an effective, low cost mechanism for providing non-volatile memory in a variety of computer related applications, such as in small handheld digital devices like cellular telephones, personal digital assistants (PDAs), etc.

A one time programmable EPROM cell generally comprises a transistor that can be programmed once so that a particular amount of charge is stored within the cell, where the amount of charge stored within the cell corresponds to digital data (i.e., 0 or 1). An OTP transistor is programmed by applying a first known voltage to the cell, and the data stored within the cell is read basically by applying a second different voltage to the cell and reading a resulting current that flows through the cell. A first amount of current generally corresponds to a logic 1, while a second amount of current generally corresponds to a logic 0.

OTP EPROM cells may be utilized to store configuration data, for example, in electronic devices. It can be appreciated that it is desirable for such data to remain continually accessible over long periods of time, such as for up to several years, for example. However, aspects of conventionally designed OTP transistors provide for weak spots that can result in electrical tunneling, which can cause a charge stored within an OTP transistor to diminish over time, which can lead to erroneous or false data reads.

Accordingly, it would be desirable to design an OTP transistor based EPROM cell in a manner that mitigates weak spots and resulting adverse effects associated with tunneling phenomena.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming a one time programmable (OTP) electrically programmable read only memory (EPROM) having improved data retention. In particular, a transistor based EPROM cell is redesigned to obviate weak spots existing in conventionally designed EPROM cells. More particularly, the EPROM transistor is redesigned so that a gate structure of the transistor does not overlap surrounding isolation material (e.g., shallow trench isolation (STI) material). The memory cell generally comprises multiple concentric rings of polysilicon material out of which one or more gate structures are formed. In this manner, gate structures formed from the inner polysilicon ring do not overlap surrounding isolation material due to the presence of the one or more outer polysilicon rings. In addition to isolating the inner ring from isolation material, the second ring also facilitates increased density in a memory array formed out of a plurality of such cells by serving as a mechanism for connecting the cells to one another in respective rows of the array (e.g., in lieu of more conventional interconnections, such as larger metal interconnects). Further, the second ring provides a mechanism for selecting the respective cells. As such, the second ring generally integrates cell selection with more compact memory that has enhanced silicon area utilization.

According to one or more aspects of the present invention, a one time programmable (OTP) transistor based electrically programmable read only memory (EPROM) cell is disclosed. The cell includes an inner ring of semiconductor material formed upon an active area of a semiconductor substrate, where an inner transistor of the memory cell is at least partially formed out of the inner ring of semiconductor material. The cell also has an outer ring of semiconductor material formed upon the active area of the semiconductor substrate, where an outer transistor of the memory cell is at least partially formed out of the outer ring of semiconductor material. Further, the outer ring of semiconductor material is formed such that it surrounds the inner ring of semiconductor material so that there is no overlap between the inner ring of semiconductor material and a region of isolation material that electrically isolates the active area from one or more other active areas of the semiconductor substrate.

In accordance with one or more other aspects of the present invention, a method of forming a one time programmable (OTP) transistor based electrically programmable read only memory (EPROM) cell is disclosed. The method includes forming a doped well within an active area of a semiconductor substrate, where the active area is electrically isolated from one or more other active areas of the substrate by a region of isolation material. A thin layer of gate dielectric material is formed over the active area, and a layer of gate electrode material is formed over the thin layer of gate dielectric material. The layer of gate electrode material and the thin layer of gate dielectric material are patterned to establish an inner ring and an outer ring, where the inner ring defines a gate structure for an inner transistor and the outer ring defines a gate structure for an outer transistor. A first doped region of the substrate is then formed inside the inner ring, and a second doped region of the substrate is formed between the inner and outer rings. Also, a third doped region of the substrate is formed between the outer ring and the isolation material, where the inner transistor is at least partially formed out of the first and second doped regions, and the outer transistor is at least partially formed out of the second and third doped regions. A first contact is formed within the first doped region to enable the first doped region to be contacted, and a third contact is formed within the third doped region to enable the third doped region to be contacted.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
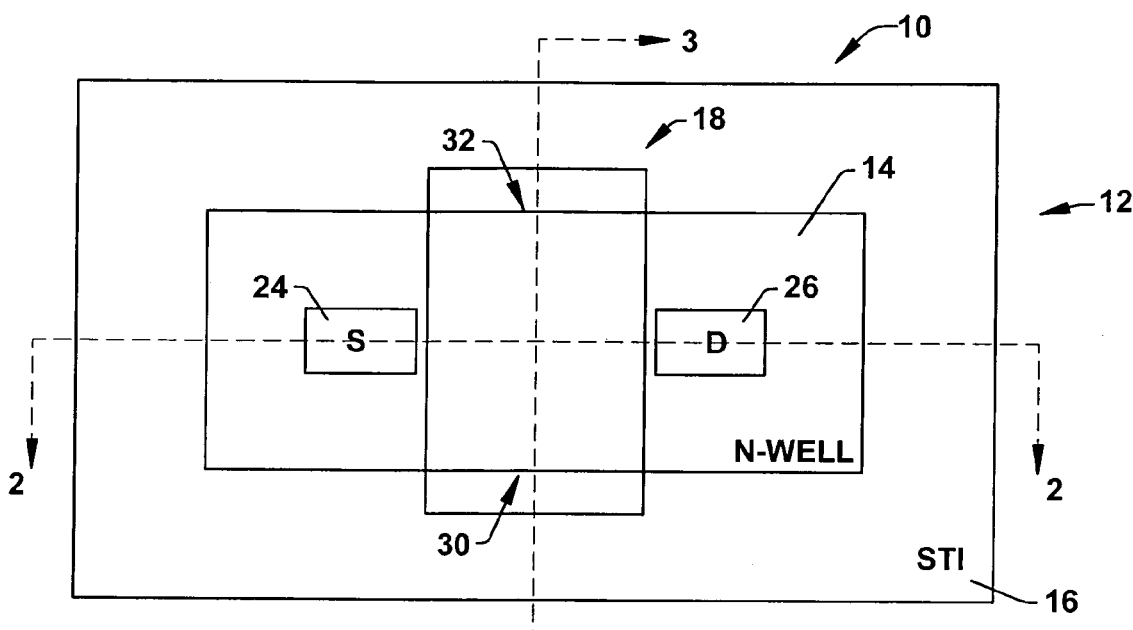
FIG. 1 illustrates a top view of a conventional one time programmable (OTP) transistor based electrically programmable read only memory (EPROM) cell.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

One or more aspects of the present invention pertain to forming a one time programmable (OTP) transistor based electrically programmable read only memory (EPROM) cell that lacks a conventional configuration where a gate structure overlaps isolation material. Charge loss that can occur at such overlapping 'weak points' is thus mitigated, and the memory cell thereby has improved data retention. The overlap is obviated by forming a gate structure out of an inner ring of polysilicon material that is surrounded by one or more outer rings of polysilicon material, where the one or more outer rings of polysilicon material shield the inner gate structure from isolation material. Additionally, the outer ring of polysilicon material also serves to enhance silicon utilization by facilitating increased density in a memory array formed out of such cells. In particular, the outer ring allows cells within rows of the array to be operatively coupled to one another. In this manner, deficiencies associated with more conventional techniques for connecting such cells, such as taking up more silicon area with metal interconnects are overcome. The second ring also provides a mechanism for selecting the cells so that the need for additional elements can be further reduced. The second ring thus integrates cell selection with efficient silicon utilization.

Figure 2:
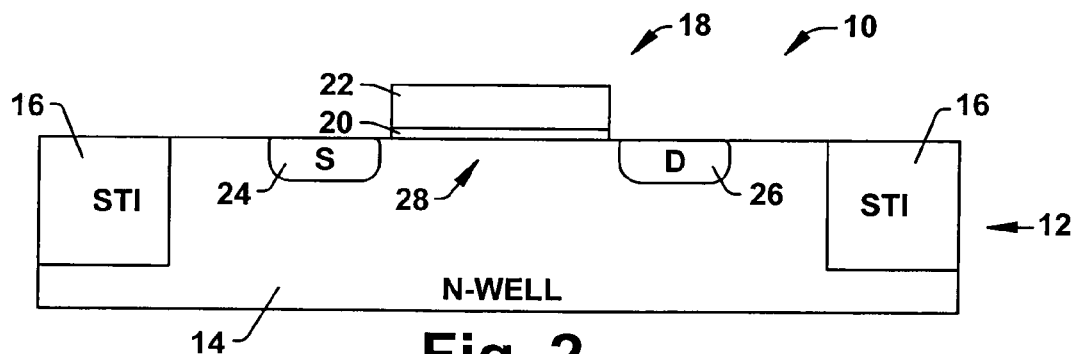
FIG. 2 is a fragmentary cross sectional diagram illustrating the conventional OTP EPROM of FIG. 1 taken along lines 2-2.
Figure 3:
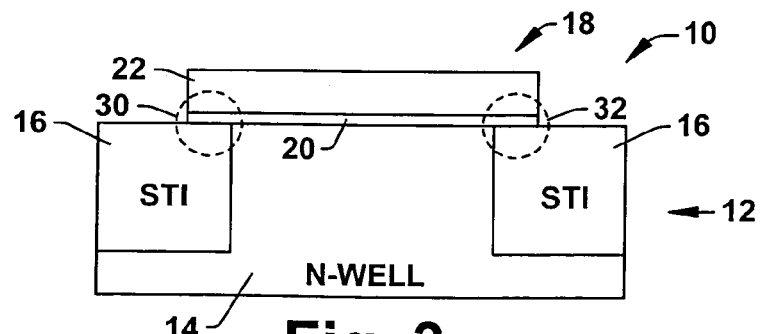
FIG. 3 is a fragmentary cross sectional diagram illustrating the conventional OTP EPROM of FIG. 1 taken along lines 3-3.

FIG. 1 is a top view of a conventional one time programmable (OTP) transistor based electrically programmable read only memory (EPROM) cell 10. FIG. 2 is a fragmentary cross sectional diagram illustrating the conventional OTP EPROM 10 of FIG. 1 taken along lines 2-2. Similarly, FIG. 3 is a fragmentary cross sectional diagram illustrating the conventional OTP EPROM 10 of FIG. 1 taken along lines 3-3. The cell 10 is formed upon a semiconductor substrate 12, a portion of which has an n type dopant applied thereto to form an NWELL region 14 therein. Likewise, a portion of the substrate is removed (e.g., etched) and filled with an isolation material 16 (e.g., an oxide based material), such as via shallow trench isolation (STI) and/or local oxidation of silicon (LOCOS), for example. The isolation material 16 electrically isolates active areas of the substrate 12, such as where the cell 10 is formed, form other active areas of the substrate 12, such as where other memory cells are formed.

A gate structure 18 is formed over the NWELL region 14, where the gate structure comprises a thin gate dielectric 20 and a gate electrode 22. The gate dielectric 20 is formed out of a nonconductive material, such as an oxide based material, for example. The gate electrode 22 serves as an electrical contact for the transistor gate 18 and is thus formed out of a conductive or semi-conductive material such as a polysilicon based material, for example, that may or may not be doped. Source 24 and drain 26 regions are formed in the substrate by a doping process on either side of the gate structure 18. The source 24 and drain 26 regions thereby establish a channel region 28 within the substrate 12 beneath the gate structure 18.

In this conventional arrangement, however, it can be seen that some of the gate structure 18 overlaps the isolation material 16 (FIGS. 1 and 3). This creates 'weak spots' at locations 30 and 32 wherein charge stored in the transistor 10 can leak out or be lost due to tunneling. More particularly, the process of forming the thin gate dielectric 20 leaves the dielectric material slightly thinner at locations 30 and 32. For example, most of the dielectric material 20 may be around 70 Angstroms thick, but may taper down to a thickness of only around 60 Angstroms at its edges 30, 32. This diminished thickness at the dielectric edges can lead to an increased electric field at locations 30 and 32, which can in turn allow charge stored within the cell 12 to leak out or diminish over time.

Figure 4:
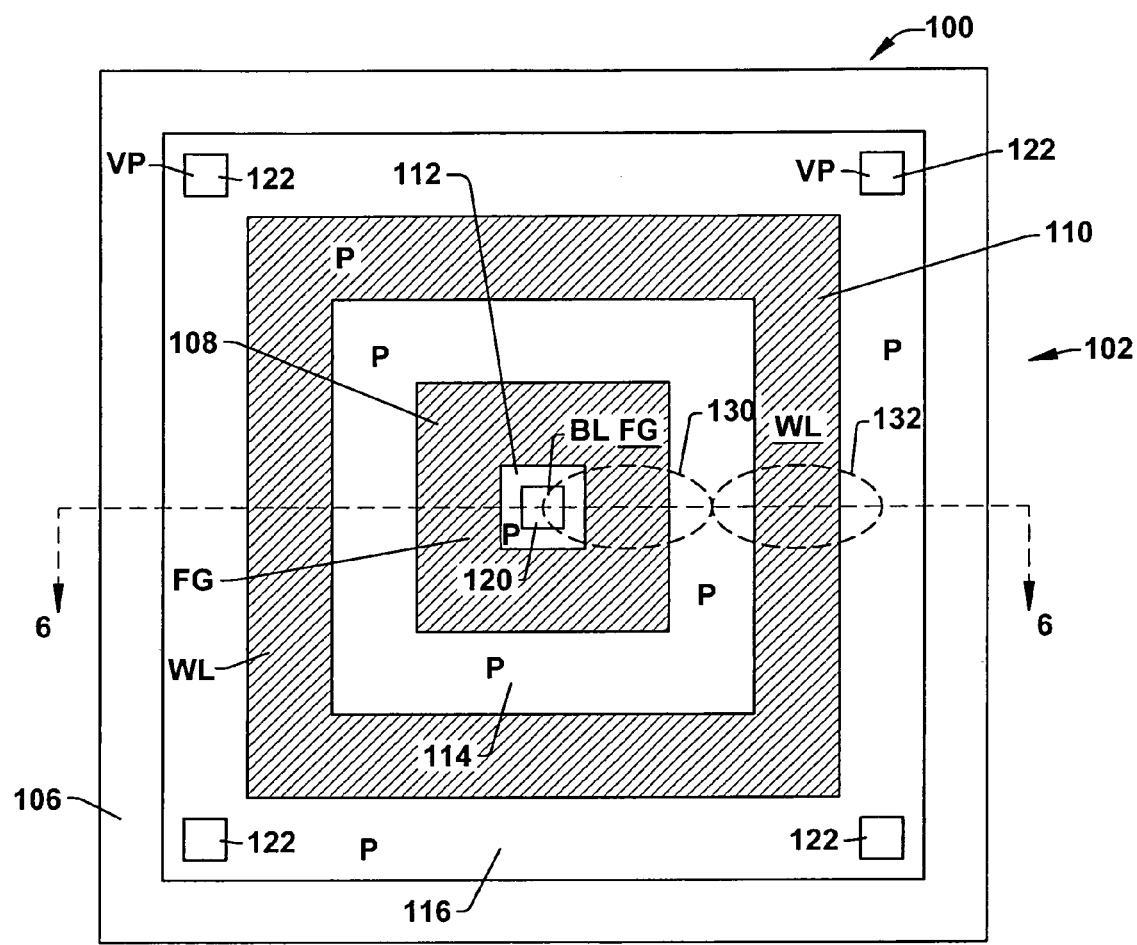
FIG. 4 illustrates a top view of an exemplary one time programmable (OTP) transistor based electrically programmable read only memory (EPROM) cell formed according to one or more aspects of the present invention.
Figure 5:
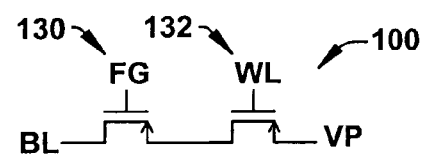
FIG. 5 is a circuit schematic representation of a memory cell according to the arrangement of FIG. 4.
Figure 6:
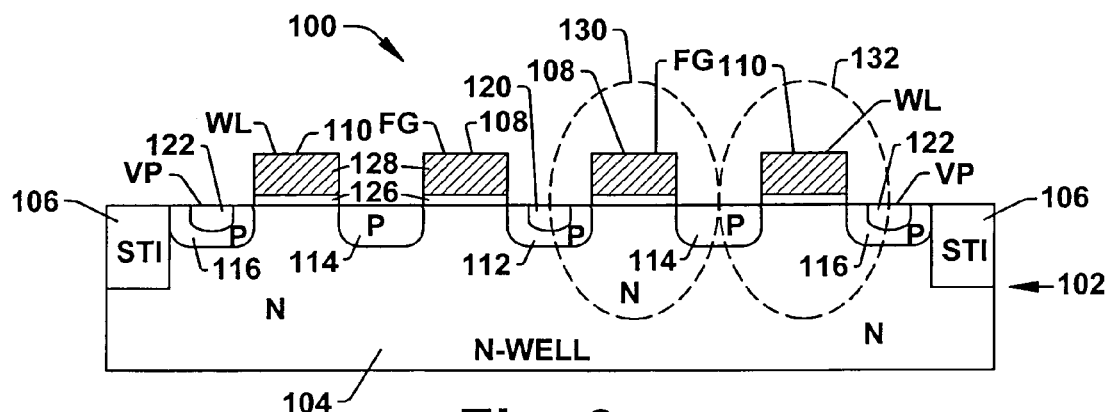
FIG. 6 is a fragmentary cross sectional diagram illustrating the OTP EPROM of FIG. 4 taken along lines 6-6.
Figure 8:
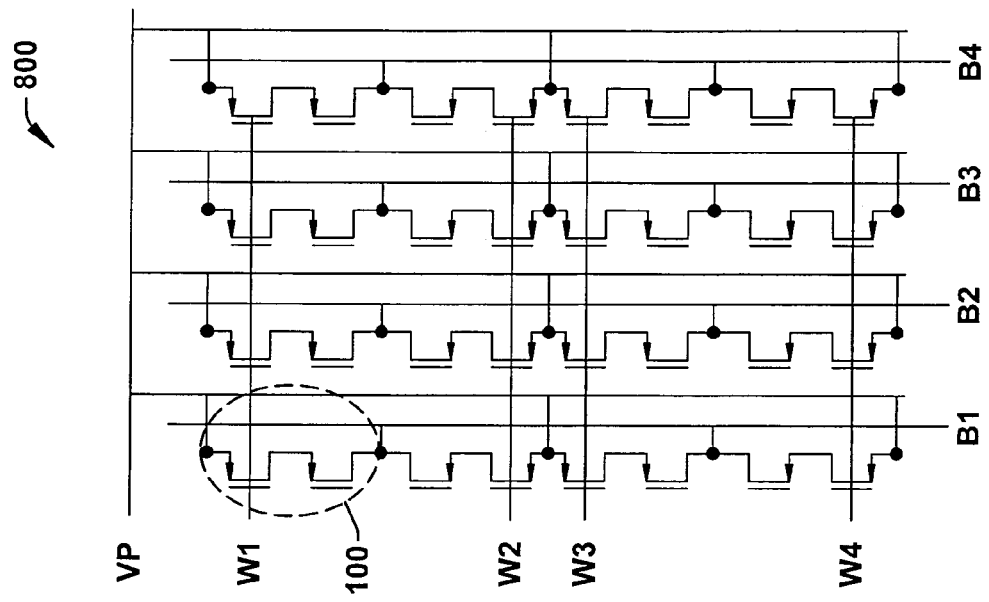
FIG. 8 is a circuit schematic representation of the array of OTP EPROM cells of FIG. 7.

FIG. 4 is a top view of an exemplary one time programmable (OTP) transistor based electrically programmable read only memory (EPROM) cell 100 formed according to one or more aspects of the present invention. FIG. 5 is a circuit schematic depiction of the memory cell 100 of FIG. 4, and FIG. 6 is a fragmentary cross sectional diagram of the OTP EPROM 100 of FIG. 4 taken along lines 6-6. The cell 100 is formed upon a semiconductor substrate 102, and more particularly within an NWELL region 104 within the substrate 102. The NWELL region 104 is defined by applying an n type dopant to that region of the substrate 102. It will be appreciated that the term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate 102 may comprise a semiconductor wafer (e.g., silicon, SiGe, or an SOI wafer) or one or more die on a wafer, and any epitaxial layers or other type semiconductor layers formed thereover or associated therewith. Similarly, while particular n and p type dopings are described herein according to NMOS technology, it is to be appreciated that one or more aspects of the present invention are equally applicable to forming a PMOS (e.g., by basically reversing the n and p type dopings).

Portions of the substrate 102 are removed (e.g., etched) and filled with an isolation material 106 (e.g., (STI) and/or (LOCOS)) to separate active regions from one another. Concentric rings 108, 110 are formed over the NWELL 104. It will be appreciated that while two rings 108, 110 are illustrated in the example presented, any suitable number of such rings can be formed according to one or more aspects of the present invention. Likewise, while the illustrated rings 108, 110 are square, they can be formed in any suitable shape(s) so as to isolate the inner ring from isolation material. Additionally, the rings may or may not be concentric. It is merely important that an inner ring is shielded from isolation material 106 by an outer ring. Moreover, the second ring 110, and more particularly, a transistor established therefrom, can be used as a select transistor. As such, the second ring provides a mechanism for selecting the cell (e.g., where the cell in included in an array of such cells) so that additional 'selection circuitry' is not needed. This facilitates a more efficient use of (valuable) silicon real estate, and thus improves memory density.

A p type dopant is also applied to the substrate 102 (generally after the rings 108, 110 are formed) to create p type regions 112, 114, 116 therein. Similarly, contacts 120, 122 are formed at select locations within the substrate, such as at locations 112, 116, respectively, so that regions 112, 116 can be accessed after one or more layers of material (not shown) are subsequently formed thereover. It is to be appreciated that contacts 120, 122 are merely representative of completed contacts which would generally comprise vias formed in one or more layers of subsequently applied material and that are filled in with a conductive material. Such contacts may be formed, for example, as part of back end processing, which may include salicidation and/or metallization, for example.

The rings 108, 110 comprise a thin layer of dielectric material 126 overlying the substrate 102 and a layer of conductive material 128 overlying the dielectric 126. Accordingly, it can be appreciated that the rings 108, 110 and doped p regions 112, 114, 116 form transistors, where the rings 108, 110 comprise gate structures and the p regions comprise source and drain regions and define respective channel regions therebetween under the gate structures. For example, a first inner transistor 130 is defined by the inner ring 108 (e.g., layers 126 and 128) and the p regions 112, 114, while a second outer transistor 132 is defined by the outer ring 110 and the p regions 114, 116. It can be appreciated that data retention is enhanced in this arrangement where data (e.g., an accumulation of charge) is stored in transistor 130, for example, since the gate structure of transistor 130 does not overlap surrounding isolation material 106 (e.g., by virtue of the buffering of outer ring 110—as can be seen in FIG. 4). In this manner, weak spots (e.g., high e-field spots 30, 32 as illustrated in FIGS. 1 and 3) are obviated in this configuration, and thus so are resulting tunneling effects and commensurate charge loss.

FIG. 5 illustrates a circuit schematic of the memory cell 100 with notation corresponding to using the memory cell in a memory array. In particular, the gate of transistor 132 is labeled so as to correspond to a wordline (WL), while the gate of transistor 130 is labeled so as to correspond to a field gate (FG). Similarly, the p region 112, which may be contacted by contact 120, is labeled as a bitline (BL), and the outer p region 116, which may be contacted by contact 122, is denoted as a node where a program voltage (VP) may be applied.

Figure 7:
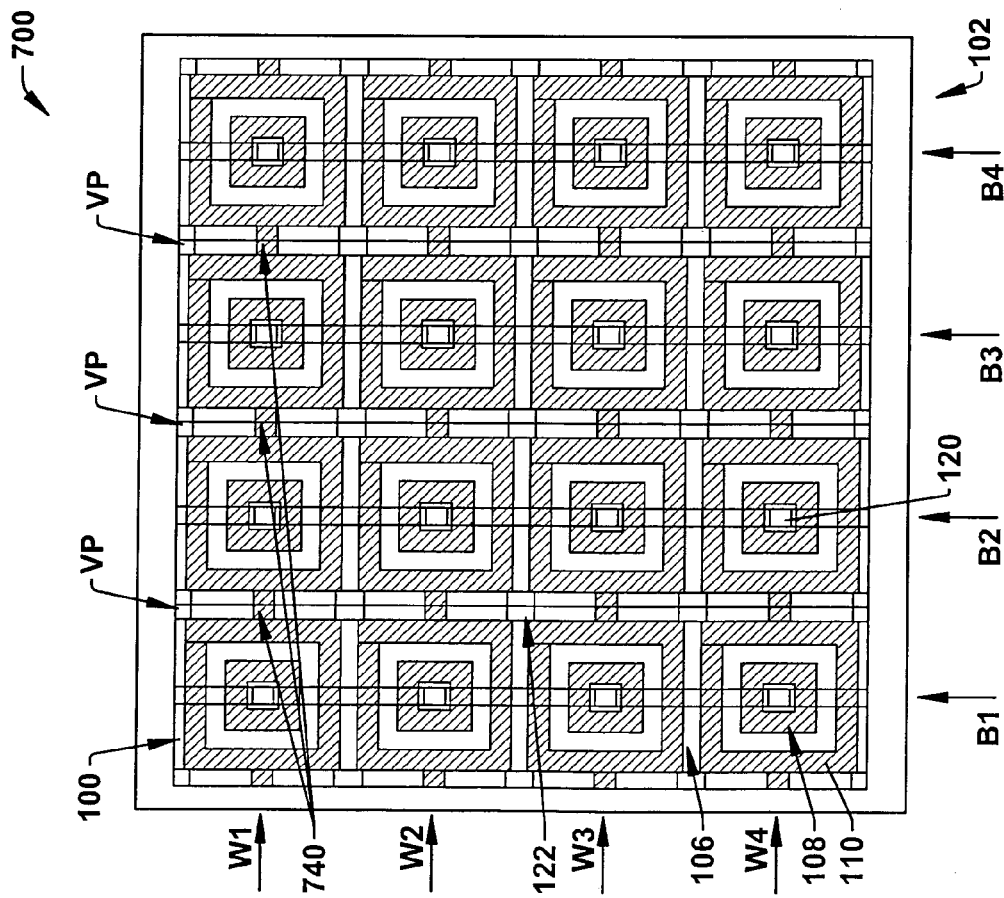
FIG. 7 illustrates a top view of an exemplary 4 by 4 array of OTP EPROM cells, such as the OTP EPROM of FIG. 4.

FIG. 7 is a top view illustration of an exemplary 4 by 4 array 700 of OTP EPROM cells, such as the OTP EPROM 100 depicted in FIGS. 4-6, and FIG. 8 is a circuit schematic 800 representation of the 4 by 4 array 700. The array 700 thus has 4 wordlines (WL1-WL4) and 4 bitlines (BL1-BL4), where the wordlines correspond to outer ring transistors and the bitlines correspond to p type regions within the substrate 102. Outer rings 110 of memory cells in respective wordlines are operatively interconnected by segments 740 of conductive material, such as polysilicon (e.g., the same material used to form the inner and outer rings 108, 110). Using outer rings 110 to interconnect the cells facilitates more efficient use of silicon area and thus enhances memory density since more conventional types of interconnects, such as metal interconnects, for example,—which require more silicon area—are no longer necessary. The different wordlines are separated from one another by isolation material 106. Respective contacts 122 within the cells 100 provide a mechanism by which a program voltage (VP) can be applied to the cells 100. Similarly, respective contacts 120 within the cells 100 allow cells within the same bitline (BL) to be operatively coupled to one another.

Figure 9:
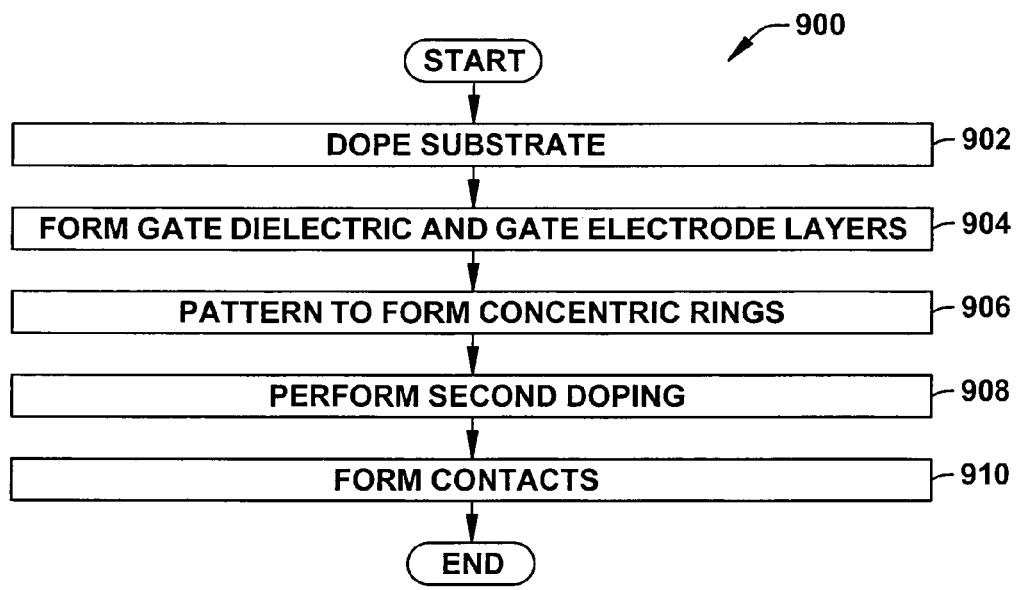
FIG. 9 is a flow diagram illustrating an exemplary methodology of forming an OTP EPROM in accordance with one or more aspects of the present invention.

FIG. 9 is a flow diagram illustrating an exemplary methodology 900 of forming an OTP EPROM 100 according to one or more aspects of the present invention, and FIGS. 10-14 are cross sectional diagrams depicting an OTP EPROM 100 being formed according to an exemplary methodology, such as that illustrated in FIG. 9. Although the methodology 900 of FIG. 9 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated acts may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate an OTP EPROM as illustrated and described below with respect to FIGS. 10-14, as well as to devices not shown or described with regard to the accompanying figures, and such figures are not intended to limit the scope of the present invention.

Figure 10:
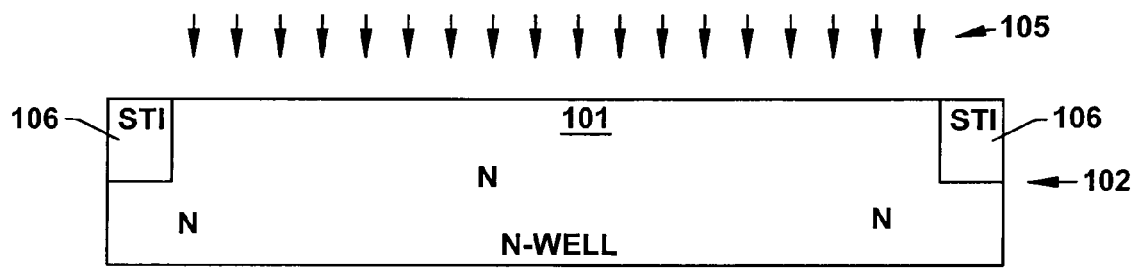
FIGS. 10-14 are fragmentary cross sectional diagrams illustrating the formation of an exemplary OTP EPROM according to one or more aspects of the present invention.

The methodology 900 begins at 902 wherein an active area 101 of a semiconductor body or substrate 102 has a first dopant applied thereto by a first implantation process 103 (FIG. 10). In the example illustrated, the active area 101 is implanted with an n type dopant (e.g., phosphorous (P), arsenic (As)) to establish an NWELL region 104 within the substrate 102. It will be appreciated that the n type dopant of the NWELL 104 is implanted in the substrate 102 at a dose (in atoms/cm$^2$) and at an associated energy (in keV). The degree of doping in this (and all other implanted areas) is thus, at least partially, dependent upon these parameters, as well as the duration of the implantation process 103. By way of example, arsenic can be implanted at a dose of between about 1E12/cm$^2$ and about 1E13/cm$^2$ at an energy level of between about 100 keV and about 500 keV. Phosphorous (e.g., P31) can similarly be implanted at a dose of between about 1E12/cm$^2$ and about 1E13/cm$^2$ at an energy level of between about 50 keV and about 1000 keV, for example. Additionally, the NWELL region 104 can also be subjected to heat treatment to activate the dopant and achieve a desired junction depth and doping profile.

The active area 101 is defined within the substrate 102 between regions containing an isolation material 106. The isolation regions 106 are formed, for example, by carving out (e.g., etching) the substrate 102 at these locations, and then filling in these areas with isolation material 106 (e.g., (STI) and/or (LOCOS)). Oxidation may occur to fill these locations 106 at a temperature of between about 850 degrees Celsius and about 1200 degrees Celsius in the presence of steam in the span of between about 30 minutes and about 600 minutes, for example. The select isolation areas 106 can be, for example, between about 4000 to about 7000 Angstroms in thickness. It will be appreciated that the doping at 902 may be performed prior to establishing the isolation regions 106. Additionally, the substrate 102 may, for example, originally possess a light p type doping (e.g., of boron (B)).

Figure 11:
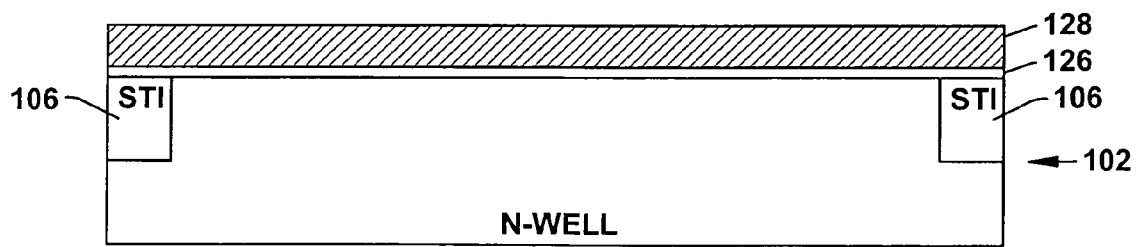

Respective layers of gate dielectric 126 and gate electrode 128 material are then formed upon the substrate 102 at 904 (FIG. 11). The layer of gate dielectric material 126 can comprise a thin layer of oxide based material, for example, formed over the upper surface of the substrate 102. The gate dielectric 126 can be formed by any suitable material formation process, such as thermal oxidation processing, for example. By way of example, layer 126 can be formed to a thickness of between about 70 Angstroms and about 500 Angstroms at a temperature of between about 600 degrees Celsius and about 1000 degrees Celsius in the presence of $O_2$, for example.

The layer of gate electrode material 128 is formed over the layer of gate dielectric material 126, and generally comprises a conductive material, such as a polysilicon based material, for example. The layer of gate electrode material 128 can be formed to a thickness of between about 800 to about 5000 Angstroms, for example. This layer 128 may also include a dopant, which may be in the layer 128 as originally applied, or may be subsequently added thereto (e.g., via a doping process).

Figure 12:
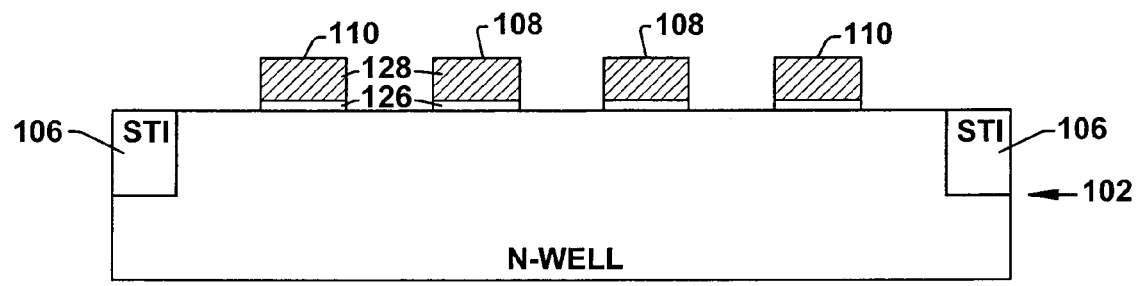

The layer of gate electrode material 128 and the layer of gate dielectric material 126 are then patterned at 906 to establish the first inner ring 108 and the second outer ring 110 (FIG. 12, and as can be seen in FIG. 4). By way of example, as with all layers and/or features described herein (unless specifically indicated otherwise), these layers 126, 128 can, at least partially, be formed via lithographic techniques, where lithography generally refers to processes for transferring one or more patterns between various media. In lithography, a radiation sensitive resist coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example.

Figure 13:
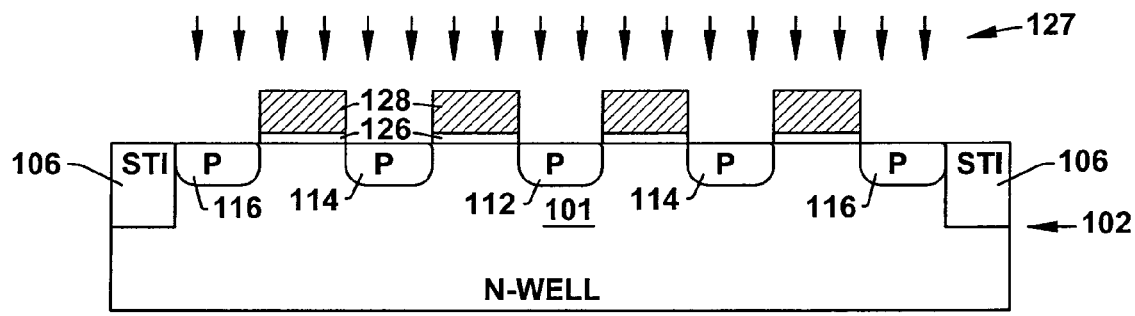
Figure 14:
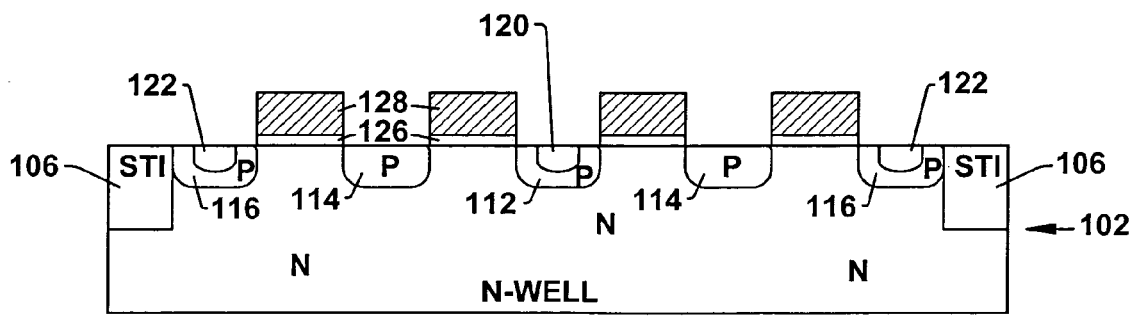

A second implantation process 127 is then performed at 908 to implant a second dopant (e.g., boron (B)) to establish p type regions 112, 114, 116 within the active area 101 of the substrate 102 (FIG. 13). By way of example, Boron (e.g., B11, BF2) can be implanted as a dose of between about $1E15/cm^2$ and about $5E15/cm^2$ at an energy level of between about 15 keV and about 150 keV to achieve a desired doping profile. The implant can also be subjected to a heat treatment. At 910, contacts 120, 122 are then formed to allow access to select locations, such as p regions 112, 116, respectively, in the illustrated example (FIG. 14). It will be appreciated that the cell 100 can be formed as part of a baseline CMOS fabrication process and thus can be readily implemented in a standard CMOS process. Accordingly, although not shown, other transistor fabrication activities can be performed at various stages of production, such as LDD, MDD, or other extension implants, for example, depending upon the type(s) of transistors to be formed, as well as forming sidewall spacers along sides of the gate structures. Similarly, back end processing can be performed, such as salicidation and/or metallization, for example.

Figure 15:
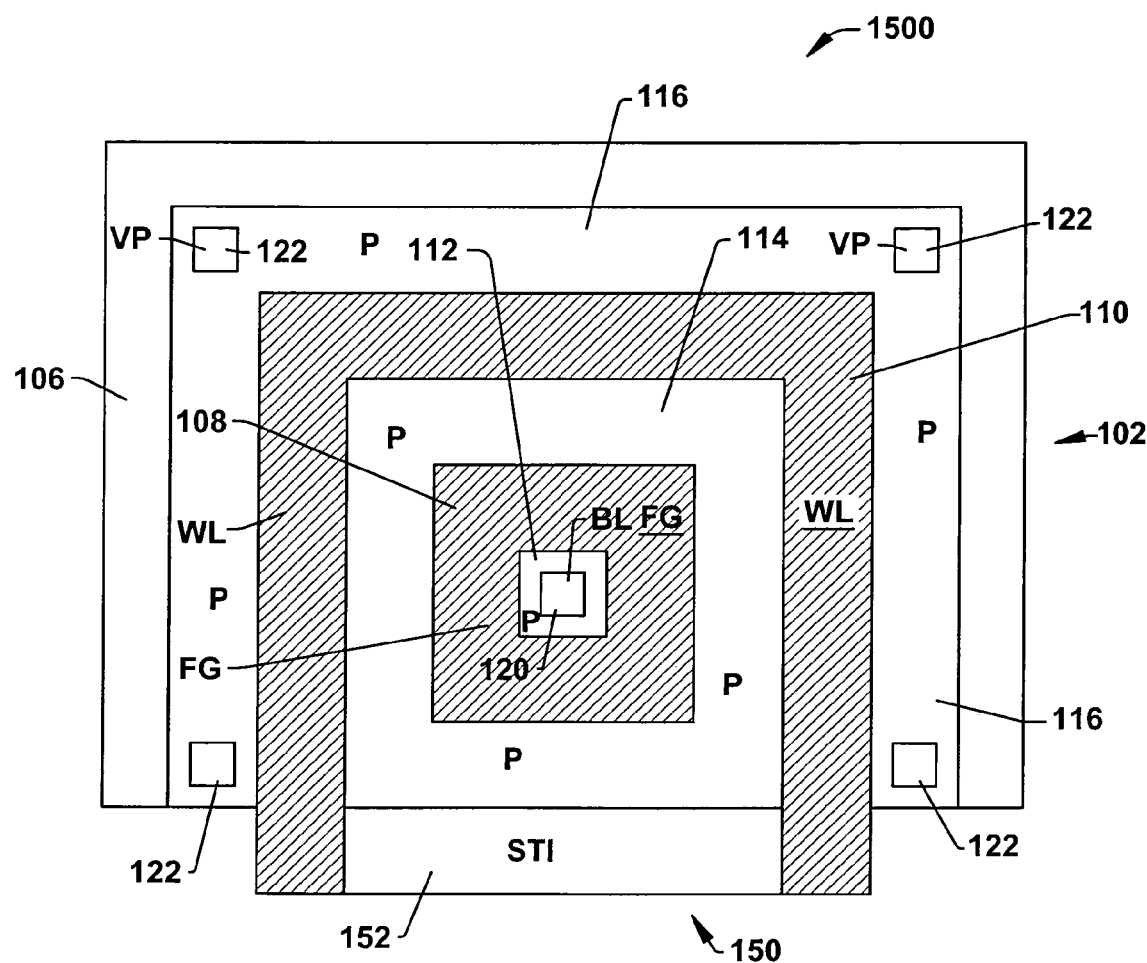
FIG. 15 illustrates a top view of another exemplary one time programmable (OTP) transistor based electrically programmable read only memory (EPROM) cell formed according to one or more aspects of the present invention.

FIG. 15 is a top view of an alternative exemplary one time programmable (OTP) transistor based electrically programmable read only memory (EPROM) cell 1500 formed according to one or more aspects of the present invention. Many of the aspects of the cell 1500 are the same as those of aforementioned cell 100. Accordingly, like reference characters are used to identify like elements, features, aspects, etc. in FIG. 15 and a further (redundant) discussion of the same is omitted for simplicity and brevity.

The outer ring has a gap 150 therein, in a bottom portion in the illustrated example, that is replaced or filled in with an isolation material 152, such as STI or LOCOS, for example. Additionally, the outer p type region 116 is pulled back slightly near this bottom portion. It will be appreciated that the cell 1500 can be formed in the manner described above with regard to forming cell 100. As such, the bottom portion 150 of outer ring 110 can be omitted merely by adjusting a mask when patterning to form the concentric rings 108, 110, as described above with regard to 906. Similarly, a mask can be adjusted when performing a p type implant, such as at 908, to pull back the outer p type region 116.

Figure 16:
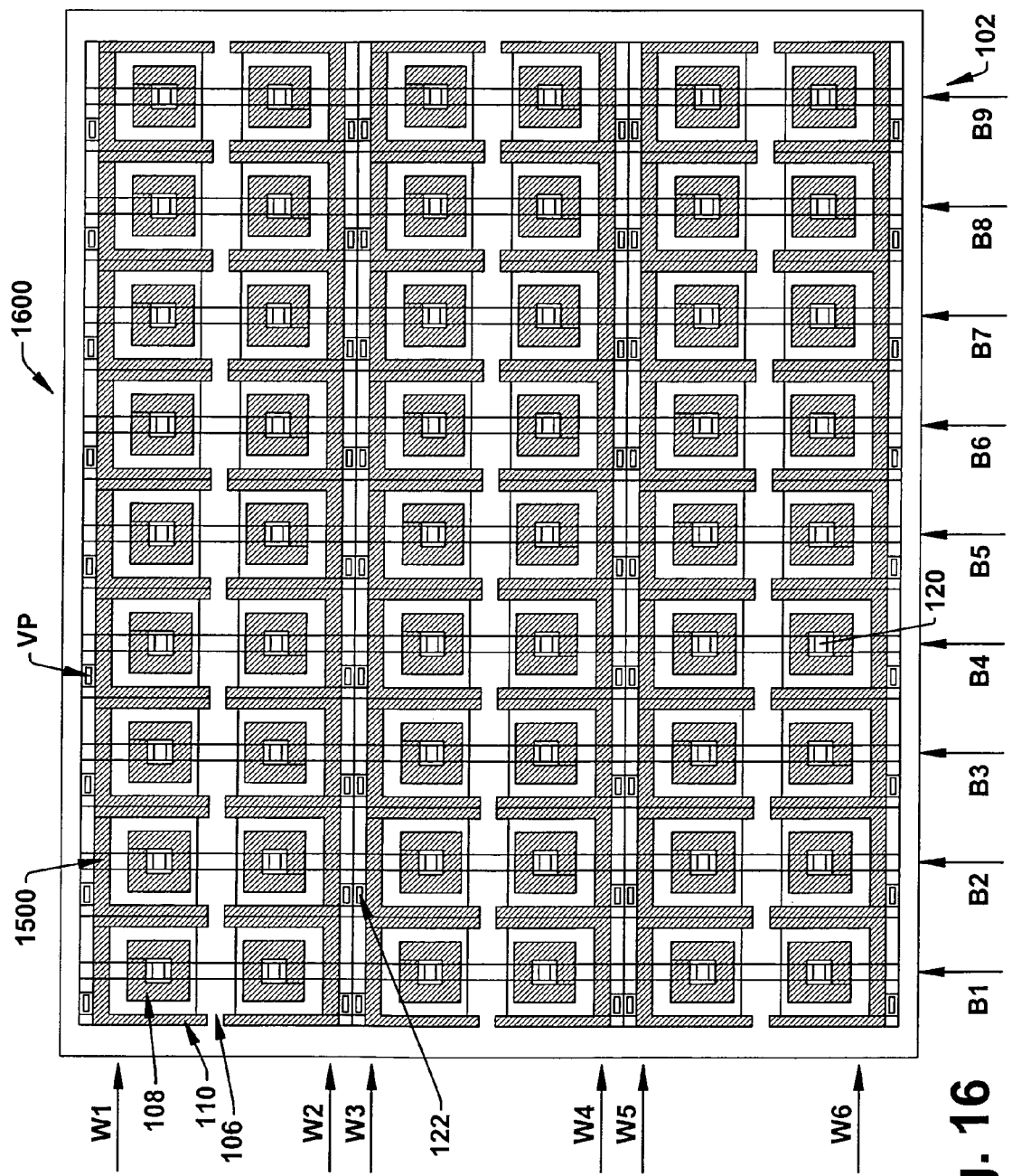
FIG. 16 illustrates a top view of an exemplary 6 by 9 array of OTP EPROM cells, such as the OTP EPROM presented in FIG. 15.

It will be appreciated that the configuration of cell 1500 is conducive to forming an array where spacing, size and/or design requirements necessitate a long, narrow array, i.e., where the array has more rows of cells than columns of cells. FIG. 16 illustrates just such an arrangement. In particular, FIG. 16 presents a top view of an exemplary 6 by 9 array 1600 of OTP EPROM cells, such as the OTP EPROM 1500 presented in FIG. 15. It will be appreciated that many of the aspects of array 1600 are the same as those of aforementioned array 700. Accordingly, like reference characters are used to identify like elements, features, aspects, etc. in FIG. 16 and a further (redundant) discussion of the same is omitted for simplicity and brevity.

The 6 by 9 array 1600 has 6 wordlines (WL1-WL6) and 9 bitlines (BL1-BL9). The cells 1500 are operatively coupled to one another in respective wordlines (WL) via their outer (polysilicon) rings 110. The different wordlines are separated from one another by an isolation material 106. Respective contacts 122 within the cells 1500 provide a mechanism by which a program voltage (VP) can be applied to the cells 1500. Similarly, respective contacts 120 within the cells 1500 allow cells within the same bitline (BL) to be operatively coupled to one another.

Accordingly, it can be appreciated that an OTP EPROM transistor formed as described herein can be produced in an efficient and cost effective manner as part of an existing or baseline CMOS fabrication process. Multiple memory cells can be operatively coupled to one another to form arrays of desired dimensions. Further, the configuration of memory cells formed as described herein obviates the occurrence of weak spots within the cells so that adverse tunneling effects are thereby mitigated and data retention is improved.

Although the invention has been illustrated and described with respect to one or more implementations, equivalent alterations and modifications will occur to others skilled in the art upon the reading and understanding of this specification and the annexed drawings. For example, the cells described herein can be connected to establish memory arrays of any desired dimensions—e.g., M by N arrays, where M and N are positive integers. The 4 by 4 and 6 by 9 arrays presented and described herein are thus not intended to limit the present invention. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising." It is also to be appreciated that elements and/or layers depicted herein are illustrated with particular dimensions relative to one another (e.g., layer to layer dimensions and/or orientations) for purposes of simplicity and ease of understanding, and that the actual dimensions of such elements/layers may differ substantially from that illustrated herein. Also, the term "exemplary" is merely meant to mean an example, rather than "the best". Further, it is also to be appreciated that the ordering of the acts described herein can be altered and that any such re-ordering is contemplated as falling within the scope of one or more aspects of the present invention.

What is claimed is:

1. A one time programmable (OTP) transistor based electrically programmable read only memory (EPROM) cell, comprising:
   an inner ring of semiconductor material formed upon an active area of a semiconductor substrate, an inner transistor of the memory cell at least partially formed out of the inner ring of semiconductor material;
   an outer ring comprising semiconductor material formed upon the active area of the semiconductor substrate, wherein a word line for the memory cell which surrounds the inner ring on at least three sides and an outer transistor of the memory cell are at least partially formed out of the outer ring; and
   a region of isolation material that electrically isolates the active area from one or more other active areas of a memory array, where the outer ring surrounds the inner ring of semiconductor material such that there is no overlap between the isolation material and the inner ring of semiconductor material.

2. The memory cell of claim 1, further comprising:
   a first doped region of the substrate inside of the inner ring of semiconductor material;
   a second doped region of the substrate between the inner and outer rings; and
   a third doped region of the substrate between the outer ring and the isolation material, where the inner transistor is at least partially formed out of the first doped region and the second doped region, and the outer transistor is at least partially formed out of the second doped region and the third doped region.

3. The memory cell of claim 2, further comprising:
   a first contact formed within the first doped region to enable the first doped region to be contacted; and
   a third contact formed within the third doped region to enable the third doped region to be contacted.

4. The memory cell of claim 3, further comprising:
   a thin inner ring of dielectric material juxtaposed between the inner ring of semiconductor material and the semiconductor substrate, the thin inner ring of dielectric material and the inner ring of semiconductor material defining a gate structure of the inner transistor; and
   a thin outer ring of dielectric material juxtaposed between the outer ring and the semiconductor substrate, the thin outer ring of dielectric material and the outer ring defining a gate structure of the outer transistor.

5. The memory cell of claim 4, wherein the first and second doped regions serve as source and drain regions for the inner transistor, and the second and third doped regions serve as source and drain regions of the outer transistor.

6. The memory cell of claim 5, wherein at least one of;
   the inner and outer rings of semiconductor material comprise a polysilicon based material, the thin inner and outer rings of dielectric material comprise an oxide based material, the third contact allows a program voltage to be applied to the cell, the active region of the substrate is itself doped before the inner and outer rings and the first and second doped regions are established to establish a doped well within the active region of the substrate, and the isolation material comprises at least one of STI and LOCOS.

7. The memory cell of claim 6, wherein the cell is operatively coupled to one or more other of such cells to form an array of such cells,
   where respective outer rings of memory cells within a row of the array are operatively coupled to one another by semiconductor material so that the cells within respective rows are operatively coupled to one another, respective rows of cells serving as wordlines in the array,
   where rows of cell are separated from one another by isolation material, and
   where cells within columns of the array are operatively coupled to one another by respective first contacts of the cells, respective columns of cells serving as bitlines of the array.

8. The memory cell of claim 1, wherein the outer ring has a gap in the semiconductor material that is filled in by isolation material.

9. The memory cell of claim 6, wherein the outer ring has a gap that is tilled in by isolation material.

10. The memory cell of claim 9, wherein the cell is operatively coupled to one or more other of such cells to form said memory array of such cells,
    where respective outer rings of memory cells within a row of the memory array are operatively coupled to one another so that the cells within respective rows are operatively coupled to one another, respective rows of cells serving as wordlines in the array,
    where rows of cell are separated from one another by isolation material, and the isolation material in the gap of the outer ring in the respective cells faces the separating isolation material, and where cells within columns of the memory array are operatively coupled to one another by respective first contacts of the cells, respective columns of cells serving as bitlines of the array.

11. A method of forming a one time programmable (OTP) transistor based electrically programmable read only memory (EPROM) cell, comprising:

forming an inner ring of semiconductor material upon an active area of a semiconductor substrate, an inner transistor of the memory cell being at least partially formed out of the inner ring of semiconductor material; and forming an outer ring of semiconductor material upon the active area of the semiconductor substrate, with a wordline for the memory cell which surrounds the inner ring on at least three sides and an outer transistor of the memory cell being at least partially formed out of the outer ring of semiconductor material, where the active area is electrically isolated from one or more other active areas of a memory array formed in the semiconductor substrate by a region of isolation material, the outer ring of semiconductor material being formed such that it surrounds the inner ring of semiconductor material so that there is no overlap between the isolation material and the inner ring of semiconductor material.

12. The method of claim 11, further comprising:
forming a first doped region of the substrate inside of the inner ring of semiconductor material;
forming a second doped region of the substrate between the inner and outer rings of semiconductor material; and
forming a third doped region of the substrate between the outer ring of semiconductor material and the isolation material, where the inner transistor is at least partially formed out of the first doped region and the second doped region, and the outer transistor is at least partially formed out of the second doped region and the third doped region.

13. The method of claim 12, further comprising:
forming a first contact within the first doped region to enable the first doped region to be contacted; and
forming a third contact within the third doped region to enable the third doped region to be contacted.

14. The method of claim 13, further comprising:
forming a thin inner ring of dielectric material between the inner ring of semiconductor material and the semiconductor substrate, the thin inner ring of dielectric material and the inner ring of semiconductor material defining a gate structure of the inner transistor; and
forming a thin outer ring of dielectric material between the outer ring of semiconductor material and the semiconductor substrate, the thin outer ring of dielectric material and the outer ring of semiconductor material defining a gate structure of the outer transistor.

15. The method of claim 14, wherein the first and second doped regions serve as source and drain regions for the inner transistor, and the second and third doped regions serve as source and drain regions of the outer transistor.

16. The method of claim 15, wherein at least one of;
the inner and outer rings of semiconductor material comprise a polysilicon based material,
the thin inner and outer rings of dielectric material comprise an oxide based material,
the third contact allows a program voltage to be applied to the cell,
the active region of the substrate is itself doped before the inner and outer rings and
the first and second doped regions are established to establish a doped well within the active region of the substrate, and
the isolation material comprises at least one of STI and LOCOS.

17. A method of forming a one time programmable (OTP) transistor based electrically programmable read only memory (EPROM) cell, comprising:

forming a doped well within an active area of a semiconductor substrate, where the active area is electrically isolated from one or more other active areas of a memory array by a region of isolation material;

forming a thin layer of gate dielectric material over the active area;

forming a layer of gate electrode material over the thin layer of gate dielectric material;

patterning the layer of gate electrode material and the thin layer of gate dielectric material to establish an inner ring and an outer ring, where the inner ring defines a gate structure for an inner transistor and the outer ring defines a gate structure for an outer transistor;

forming a first doped region of the substrate inside the inner ring;

forming a second doped region of the substrate between the inner and outer rings;

forming a third doped region of the substrate between the outer ring and the isolation material, where the inner transistor is at least partially formed out of the first and second doped regions, and the outer transistor is at least partially formed out of the second and third doped regions;

forming a first contact within the first doped region to enable the first doped region to be contacted; and forming a third contact within the third doped region to enable the third doped region to be contacted.

18. The method of claim 17, wherein the outer ring has a gap therein that is filled in by isolation material.

19. The method of claim 17, wherein the first and second doped regions serve as source and drain regions for the inner transistor, and the second and third doped regions serve as source and drain regions of the outer transistor.

20. The method of claim 15, wherein at least one of;
the layer of gate electrode material comprises a polysilicon based material,
the thin layer of gate dielectric material comprises an oxide based material,
the first, second and third doped regions are formed by a single implantation process;
the third contact allows a program voltage to be applied to the cell, and
the isolation material comprises at least one of STI and LOCOS.

* * * * *